(12) United States Patent
Chiu

(10) Patent No.: US 7,637,751 B1
(45) Date of Patent: Dec. 29, 2009

(54) SKIVED ELECTRICAL CONTACT FOR CONNECTING AN IC DEVICE TO A CIRCUIT BOARD AND METHOD OF MAKING A CONTACT BY SKIVING

(75) Inventor: Chia-Pin Chiu, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/456,211

(22) Filed: Jun. 12, 2009

Related U.S. Application Data

(62) Division of application No. 12/456,211, filed on Jun. 26, 2007.

(51) Int. Cl.
*H01R 12/00* (2006.01)
(52) U.S. Cl. .......................... 439/66; 439/83; 439/862; 29/874; 29/882; 29/884
(58) Field of Classification Search ................... 439/66, 439/3, 862; 29/874, 882, 884
See application file for complete search history.

(56) References Cited

U.S. PATENT DOCUMENTS

| | | |
|---|---|---|
| 3,995,516 A | 12/1976 | Boily et al. |
| 4,367,576 A | 1/1983 | Dickinson |
| 4,509,885 A | 4/1985 | Dickinson |
| 4,574,442 A | 3/1986 | Dickinson et al. |
| 5,979,276 A | 11/1999 | Blais et al. |
| 6,357,137 B1 | 3/2002 | Childs et al. |
| 6,560,835 B2 | 5/2003 | Porter et al. |
| 6,698,325 B1 | 3/2004 | Sprandel |
| 6,711,976 B2 | 3/2004 | Ostertag |
| 6,716,037 B2 | 4/2004 | Kung et al. |
| 6,787,899 B2 | 9/2004 | Rinella et al. |
| 7,024,153 B2 | 4/2006 | Weiner et al. |
| 7,025,601 B2 | 4/2006 | Dittmann et al. |
| 7,263,771 B2 | 9/2007 | Ochiai |
| 7,293,995 B2 | 11/2007 | Li |
| 2003/0150645 A1 | 8/2003 | Chiu |
| 2004/0000428 A1 | 1/2004 | Lii et al. |
| 2004/0018753 A1* | 1/2004 | Kung et al. .................... 439/66 |
| 2004/0190245 A1 | 9/2004 | Tirumala et al. |
| 2007/0002549 A1 | 1/2007 | Brusso et al. |
| 2007/0020960 A1 | 1/2007 | Williams |
| 2007/0105406 A1* | 5/2007 | Li ................................ 439/66 |

* cited by examiner

*Primary Examiner*—Tho D Ta
(74) *Attorney, Agent, or Firm*—Kerry D. Tweet

(57) ABSTRACT

The disclosed embodiments relate to the formation of an electrical contact using a skiving technique. The electrical contact includes a spring structure that has been skived away from an underlying metal body, but the spring remains coupled with the metal body which provides a base for the spring structure. The skived spring portion of the electrical contact may comprise a cantilever-like spring, a coil-like spring, or any other suitable type of spring. Such a spring contact may be used to form an electrical connection between an integrated circuit device and a circuit board (or other substrate). Other embodiments are described and claimed.

7 Claims, 7 Drawing Sheets

SKIVED ELECTRICAL CONTACT FOR CONNECTING AN IC DEVICE TO A CIRCUIT BOARD AND METHOD OF MAKING A CONTACT BY SKIVING

CLAIM OF PRIORITY

This application is a divisional of U.S. patent application Ser. No. 11/768,382, filed Jun. 26, 2007, now U.S. Pat. No. 7,566,228.

FIELD OF THE INVENTION

The disclosed embodiments relate generally to the attachment of an integrated circuit (IC) device to a circuit board, and more particularly to a skived electrical contact for connecting an IC device with a circuit board.

BACKGROUND OF THE INVENTION

One method of coupling an integrated circuit (IC) device to a circuit board is to use a socket. The socket is secured to the circuit board (e.g., a motherboard), and this socket includes an array of electrical contacts (e.g., spring contacts, etc.) arranged to mate with a corresponding array of electrical leads (e.g., pins, lands, pads, bumps, etc.) on the IC device. Typically, the socket contacts are carried or supported in a frame, housing, or other support structure. A clamp or other retention mechanism may secure the IC device in the socket and compress the IC device leads against the mating contact array of the socket to form electrical connections between these two components. The aforementioned socket may not, however, be suitable for systems having a small form factor, such as hand-held computers, cell phones, and other mobile computing systems. For example, the combined height of the socket and mating IC device may be unsuitable for these small form factor products.

Alternatively, an IC device may be directly attached to a circuit board, thereby eliminating the need for a socket. By way of example, ball-grid array (BGA) technology may be utilized to couple an IC device with a circuit board, wherein a plurality of electrical leads on the IC device (e.g., an array of solder bumps, an array of copper columns, etc.) is attached to a mating set of contacts on the circuit board (e.g., lands, pads, solder bumps, etc.). A solder reflow process may be performed to create permanent electrical (and mechanical) connections between the IC device leads and circuit board contacts. A surface mount technique, such as the above-described BGA process, can reduce the height of a circuit board assembly. However, because of the reflowed solder connections (or other permanent or semi-permanent connections), such an approach can make re-work costly, reduce flexibility in the assembly flow, and make system upgrades difficult.

DETAILED DESCRIPTION OF THE INVENTION

The disclosed embodiments relate, in part, to the formation of an electrical contact—or contact array—using a skiving technique. Other embodiments relate, in part, to devices including the aforementioned skived contacts. For example, in one embodiment, an array of skived contacts may be used to form a socketless connection between an IC device and a circuit board.

Generally, in a skiving process, a cutting tool (e.g., a blade) engages a metal body and cuts away a portion of the metal. This metal body may have any suitable shape and may comprise any suitable metal, such as, for example, copper, aluminum, brass, bronze, nickel, and silver, as well as alloys of these and other metals. The cut-away portion of metal separates from the metal body, but remains connected to this underlying body. Accordingly, a section of the metal body may be shaved off by a cutting tool, such that one end of the shaved portion curls upwards away from the body whereas an opposing end of the shaved material remains coupled with the underlying body. Thus, the shaved metal structure and the underlying metal body from which the shaved structure was formed remain a single continuous piece of material after skiving. By way of example, the shaved portion may comprise an upward-extending structure—such as a fin—that remains attached to the remaining metal body—which forms the fin's base—wherein the fin and base comprises a single piece of material. Thus, skiving may enable the formation of a structure that extends away from an underlying support or base, with this structure and the corresponding base comprising an integrated part.

Figure 1:
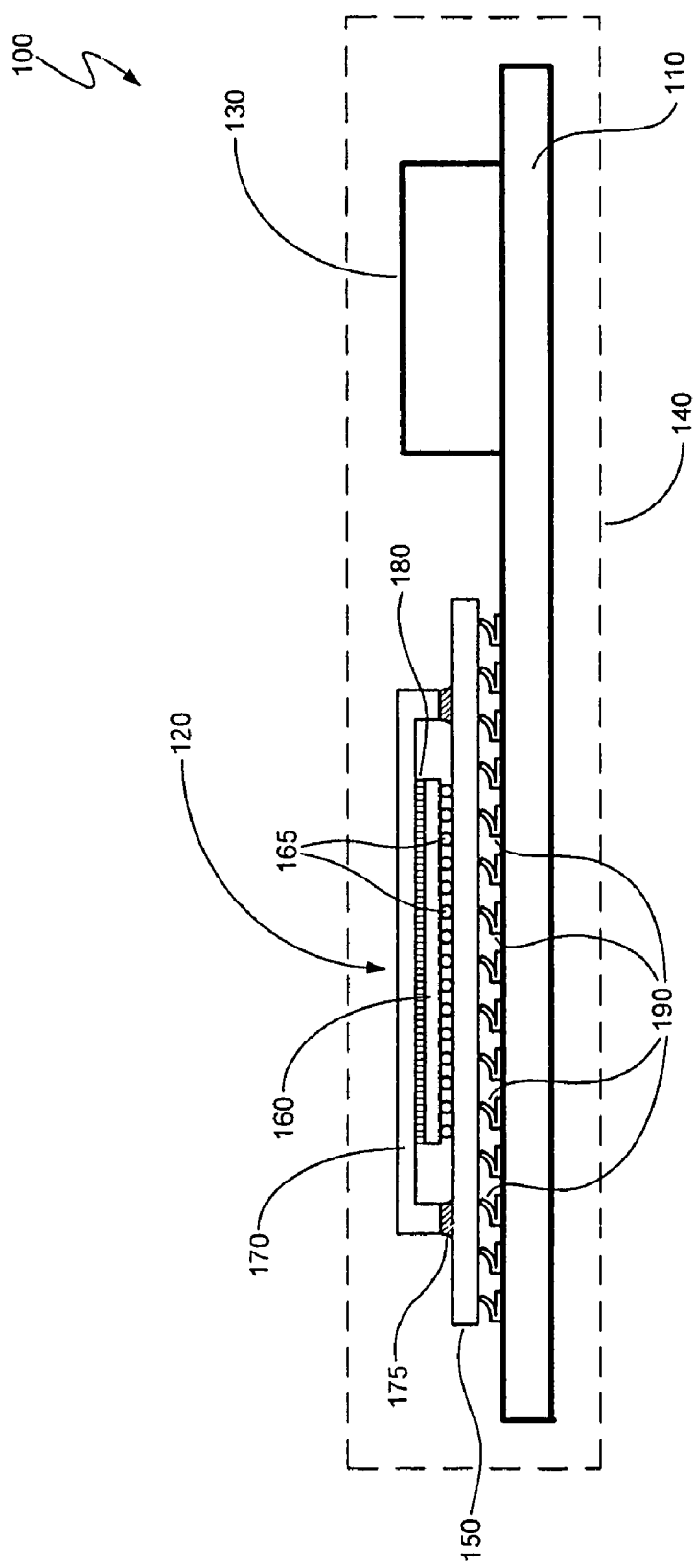
FIG. 1 is a schematic diagram illustrating an assembly including an embodiment of a skived electrical contact.

Referring now to FIG. 1, illustrated is an embodiment of an assembly 100. The assembly 100 may comprise any type of computing device. For example, the assembly 100 may comprise (or form part of) a hand-held computing device, a mobile computing device, a wireless communications device, a laptop computer, a desk-top computer, a server, etc.

The assembly 100 includes an integrated circuit (IC) device 120 that is disposed on a circuit board 110. In one embodiment, the circuit board 110 comprises any substrate capable of providing electrical communication between the components disposed on the board. For example, the circuit board 110 may comprise a multi-layer structure comprised of alternating layers of a dielectric material and a metal (e.g., copper). Further, these dielectric build-up layers may be disposed over a core layer (e.g., a dielectric material or perhaps a metal core). Any one or more of the metal layers may be formed in a desired circuit pattern to route—perhaps in conjunction with other metal layers—electrical signals to and from the devices coupled with the circuit board 110. However, the disclosed embodiments are not limited to the above-described multi-layer circuit board, and it should be understood that the disclosed embodiments may find application to other types of substrates.

The IC device 120 may include one or more processing systems, as well as other components. For example, IC device 120 may include a microprocessor, a network processor, a graphic processor, a wireless communications device, a chipset, etc., as well as any combination of these and other devices. Other components that may be disposed within IC device 120 include a memory (e.g., a flash memory, any type of Dynamic Random Access Memory, etc.), a memory controller, a voltage regulator, as well as passive components (e.g., capacitors, filters, antennas, etc.).

In addition to IC device 120, one or more additional components 130 may be disposed on the circuit board 110. Additional components 130 that may be disposed on circuit board 110 include, for example, a graphics display (e.g., a liquid crystal display, or LCD), passive components (e.g., antennas, capacitors, etc.), a cooling device (e.g., a fan or a passive cooling device, such as a heat sink), a voltage regulator, and/or a power supply (e.g., a battery), as well as other IC devices.

Also, in one embodiment, the assembly 100 includes a housing 140 that supports and/or encases the circuit board 110 and the components 120, 130 disposed thereon. This housing 140 may include one or more apertures or other access points that provide access to components disposed on the circuit board 110 (e.g., for viewing an LCD, for battery access, etc.). Housing 140 may be constructed from any suitable material or combination of materials, including plastics, metals, and/or composite materials.

With continued reference to FIG. 1, the IC device 120 includes an IC die 160 that is disposed on a substrate 150. Substrate 150 may comprise any suitable type of substrate capable of providing electrical communications between the IC die 160 and the underlying circuit board 110. The substrate 150 may also provide structural support for the die 160. By way of example, in one embodiment, substrate 150 comprises a multi-layer substrate—including alternating layers of a dielectric material and metal—built-up around a core layer (either a dielectric or metal core), as previously described. In another embodiment, the substrate 150 comprises a core-less multi-layer substrate. Other types of substrates and substrate materials may also find use with the disclosed embodiments (e.g., ceramics, sapphire, glass, etc.).

A number of interconnects 165 may extend between the IC die 160 and substrate 150. The interconnects 165 provide electrical connections between the die 160 and substrate 150, and these interconnects may also aid in mechanically securing the die to the substrate 150. In a further embodiment, a layer of underfill (not shown in figures) may be disposed between the IC die 160 and the substrate 150, and this underfill layer may also assist in securing the die to the substrate. The interconnects 165 may comprise any suitable type of interconnect and may comprise any suitable electrically conductive materials. For example, each of the interconnects 165 may comprise a copper column extending from die 160 and a mating solder bump disposed on the substrate 150 that are electrically and mechanically joined by a solder reflow process. Of course, it should be understood that many other types of interconnects and materials are possible. Further, according to one embodiment, the substrate 150 may comprise alternating layers of dielectric material and metal that are built-up around the die 160 itself, this process sometimes referred to as a "bumpless build-up process." Where such an approach is utilized, the separate interconnects 165 may not be needed (since the build-up layers may be disposed directly over the die 160).

The IC device 120 may, in one embodiment, further include a lid or heat spreader 170 (sometimes referred to as an integrated heat spreader, or IHS). The heat spreader 170 may comprise any suitable thermally conductive material, such as, for example, copper or a copper alloy. A layer of a thermal interface material (or TIM) 180 may be disposed between the die 160 and heat spreader 170. The TIM layer 180 comprises any material capable of thermally coupling (and perhaps mechanically securing) the heat spreader 170 to die 160. Suitable thermal interface materials include, for example, solders and conductive polymers. In a further embodiment, a layer of epoxy or other adhesive 175 may secure the heat spreader 170 to the underlying substrate 150. Also, in yet another embodiment, a heat sink (not shown in figures) may be thermally coupled with the heat spreader 170 (or, alternatively, a heat sink may be directly thermally coupled with the die, in which case a heat spreader may be omitted).

To electrically couple the IC device 120 to circuit board 110, a number of electrical contacts 190 are disposed on an upper surface of the circuit board 110 (or, alternatively, on a lower surface of the substrate 150). Each of the contacts 190 comprises a skived structure formed by the above-described skiving process (or any similar technique). Further, the contacts 190 are each capable of mating with a corresponding electrical lead on the IC device 120—e.g., a land, pad, or bump, etc. (not shown in figures) formed on the underside of substrate 150—to form an electrical connection between the IC device 120 and circuit board 110. Any suitable number and arrangement of the electrical contacts 190 may be employed. Typically, for example, the electrical contacts 190 are arranged in a pattern or array that matches a corresponding set of electrical leads on the IC device 120. According to one embodiment, a contact 190 includes a spring structure. For example, as shown in FIG. 1 (and FIGS. 2A-2F, which will be discussed below), a contact may comprise a cantilever-like spring. In another embodiment (as shown in FIGS. 3 and 4A-4F, which will be discussed below), a contact may comprise a coil-like spring. A retention mechanism (not shown in figures) may be used to secure the IC device 120 on circuit board 110 and, further, to compress the electrical leads on the IC device 120 against the spring contacts 190.

Figure 2A:
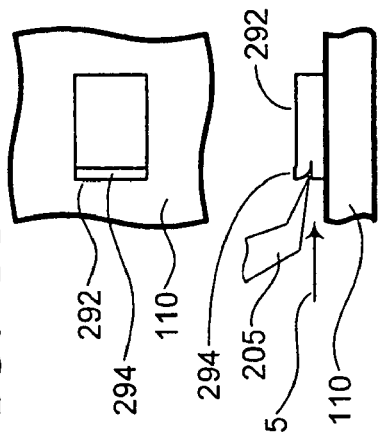
FIGS. 2A-2I are schematic diagrams illustrating an embodiment of forming the skived electrical contact shown in FIG. 1.
Figure 2B:
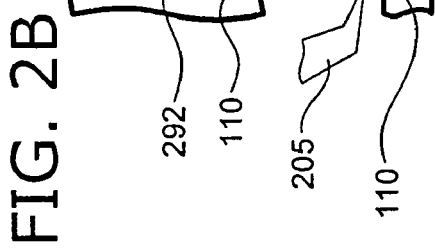
Figure 2C:
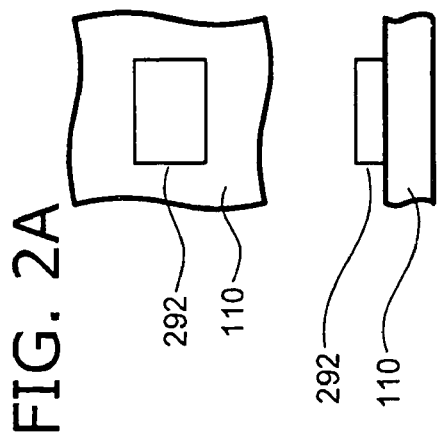
Figure 2D:
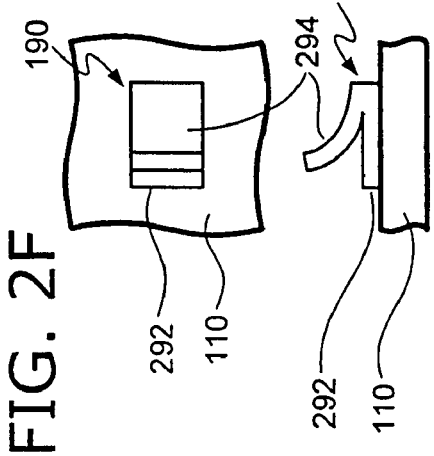
Figure 2E:
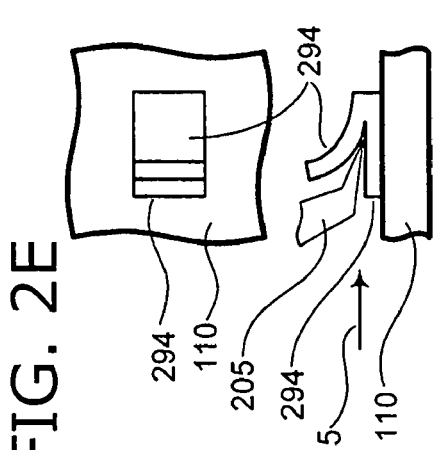
Figure 2F:
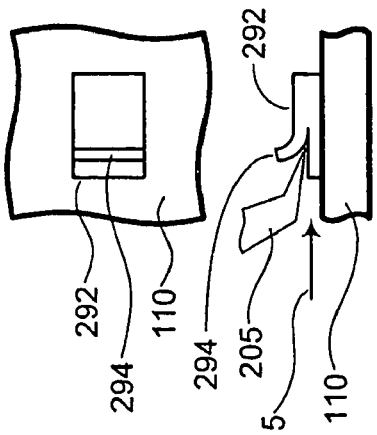
Figure 2I:
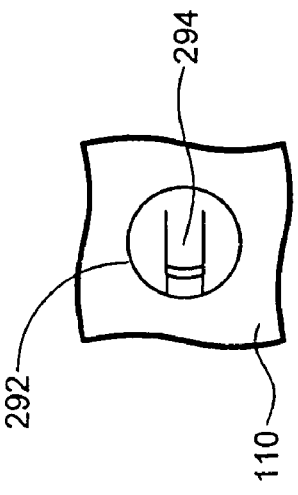
Figure 2H:
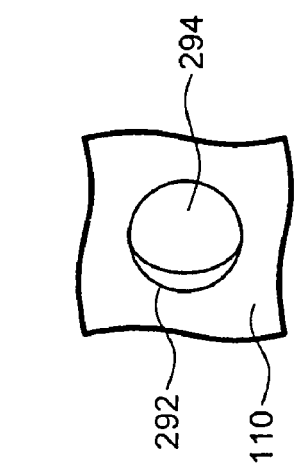
Figure 2G:
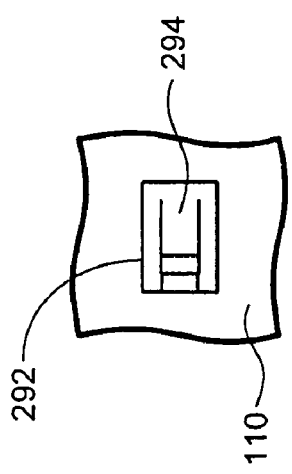

Illustrated in FIGS. 2A through 2F, as well as FIGS. 2G through 2I, are embodiments of the formation of the skived contact 190 shown in FIG. 1. Referring first to FIG. 2A, a body of metal 292 is disposed on the circuit board 110. In one embodiment, a single spring contact 190 will be formed from this metal body 292; however, in other embodiments multiple spring structures may be formed from the same metal body. It should be noted that in each of FIGS. 2A-2F, a plan view of a portion of circuit board 110 and metal body 292 (and ultimately contact 190) is shown in the upper portion of the figure, whereas a side elevation view of these structures is shown in the lower portion of the figure. In each of FIGS. 2G-2I, only a plan view is illustrated.

The metal body 292 may have any suitable shape. In one embodiment, as shown in the figures, the metal body 292 may comprise a rectangular-shaped pad or column extending upwards from the board 110. It should be understood, however, that metal body 292 may have any other suitable shape (e.g., a circular-shaped pad or column, an oval-shaped pad or column, etc.). Also, body 292 may comprise any suitable metal amenable to the skiving process. For example, the metal body 292 may comprise copper, a copper alloy (e.g., beryllium copper), aluminum, an aluminum alloy, brass and other brass alloys, phosphor bronze, nickel silver, etc. Further, in other embodiments, the body 292 may comprise an electrically conductive metal, and the metal body 292 may be electrically coupled with one or more conductors in the substrate 110.

Turning to FIG. 2B, a skiving tool 205 is shown, and this skiving tool will be used to form a spring contact by skiving. Skiving tool 205 may comprise any suitable blade or cutting tool capable of performing a skiving operation on the metal body 292 to form an electrical contact 190. The skiving tool 205 may be constructed from any suitable material (e.g., carbide, tungsten carbide, high strength steel, etc.). It should be noted that, for clarity and ease of illustration, the cutting tool 205 is only shown in the lower elevation view in each of FIGS. 2B through 2E.

Referring now to FIG. 2C, skiving has commenced, and the cutting tool 205 has engaged the metal body 292. The cutting tool 205 is moving in a direction denoted by the arrow 5 in each of FIGS. 2C-2E. As the cutting tool 205 engages the metal body 292, a portion 294 of the metal body is cut away, and this cut-away portion 294 begins to separate and, in this instance, curl upwards away from the underlying body 292. As shown in FIGS. 2D and 2E, with continued movement of the cutting tool 205 relative to the metal body 292, the size of the skived away portion 294 increases, and this structure continues to bend upwards away from the underlay body 292. In FIG. 2E, the cutting tool 205 is shown at the point of maximum cutting depth into the metal body 292.

Referring to FIG. 2F, skiving is complete, and the cutting tool 205 has been retracted from the metal body 292. After removal of the cutting tool, the skived portion 294 remains curled upwards (or otherwise separated from body 292), and this upwardly extending skived portion 294 may form a spring electrical contact (in this case, a cantilever-like spring). The remaining portion of the metal body 292 is secured to the circuit board 110 and provides a base for the skived portion 294. Together the base (un-skived portion of metal body 292) and the spring contact (skived portion 294) form a spring contact 190, and this spring contact comprises a single piece of material.

In FIGS. 2A-2F, the entire width of the rectangular-shaped metal body 292 was engaged by the cutting tool 205, such that the resulting spring contact has a width substantially the same as that of the underlying body 292. However, it should be understood that less than the entire width of the metal body 292 may be engaged by the cutting tool 205. For example, as shown in FIG. 2G, the skived portion 294 may comprise a relatively narrower strip of material shaved from a center region of the metal body 292. Also, as previously mentioned, the metal body 292 from which a skived contact 190 is formed may have any other suitable shape. By way of example, as shown in FIGS. 2H and 2I, the metal body 292 may comprise a circular-shaped pad or column. In FIG. 2H, the cutting tool has a width at least equal to a diameter of the metal body 292, and the skived portion 294 has a circular shape. Conversely, in FIG. 2I, the cutting tool is narrower than the metal body's diameter, and the skived portion 294 comprises a narrower strip of material shaved from a center region of the metal body 292 (similar to FIG. 2G).

Figure 3:
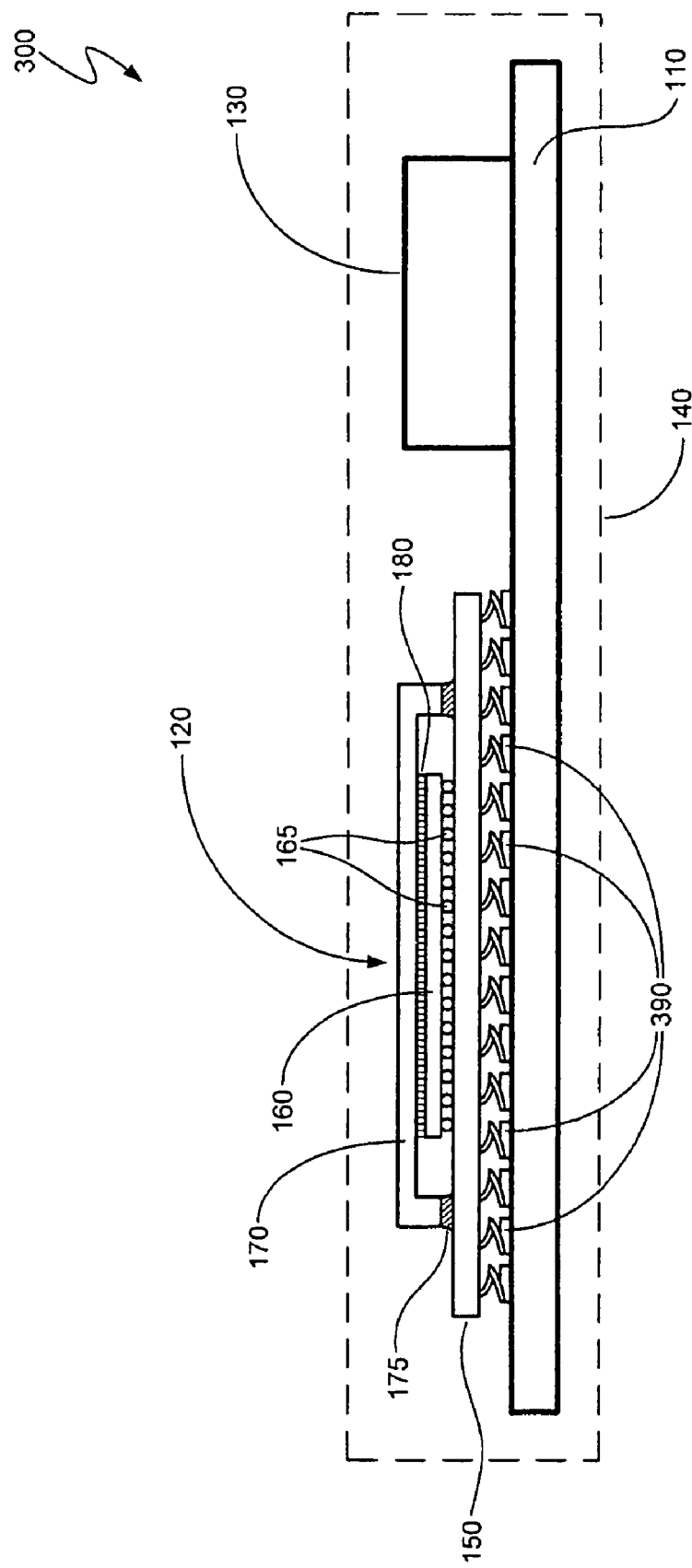
FIG. 3 is a schematic diagram illustrating an assembly including another embodiment of a skived electrical contact.

Turning now to FIG. 3, illustrated is an assembly 300 which includes another embodiment of a skived electrical contact 390. The assembly 300 is generally similar to the assembly 100 shown in FIG. 1 and described above, and like elements have retained the same numerical designations in FIG. 3. Further, a description of like elements in FIGS. 1 and 3 is not repeated here. The assembly 300 includes a number of skived electrical contacts 390 disposed on the upper surface of circuit board 110 (or, alternatively, on a lower surface of the substrate 150), and these contacts will again electrically couple the IC device 120 to board 110. Similar to the contacts 190 of FIG. 1, each of the contacts 390 comprises a skived structure, and each is capable of mating with a corresponding electrical lead on the IC device 120—e.g., a land, pad, or bump, etc. (not shown in figures) formed on the underside of substrate 150—to form an electrical connection between the IC device 120 and circuit board 110. In the embodiment of FIG. 3, however, each of the contacts 390 comprises a coil-like spring. Any suitable number and arrangement of the electrical contacts 390 may be employed, and in one embodiment the contacts 390 are arranged in a pattern or array that matches a corresponding set of electrical leads on the IC device 120.

Figure 4A:
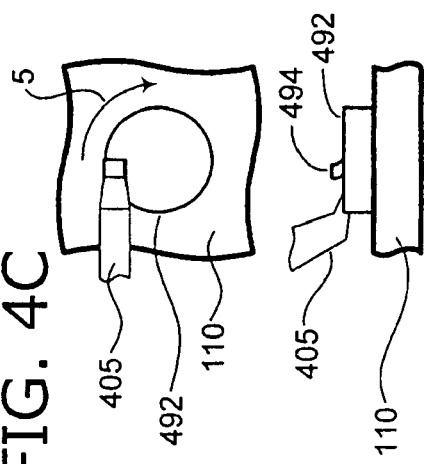
FIGS. 4A-4H are schematic diagrams illustrating an embodiment of forming the skived electrical contact shown in FIG. 3.
Figure 4B:
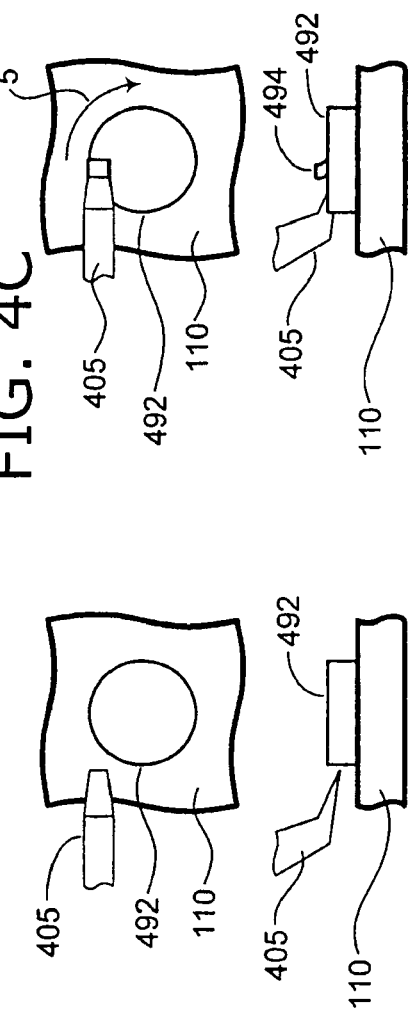
Figure 4C:
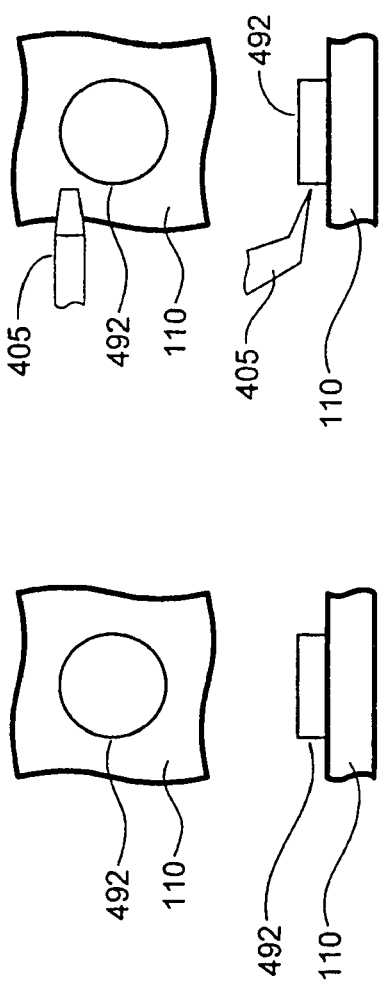
Figure 4D:
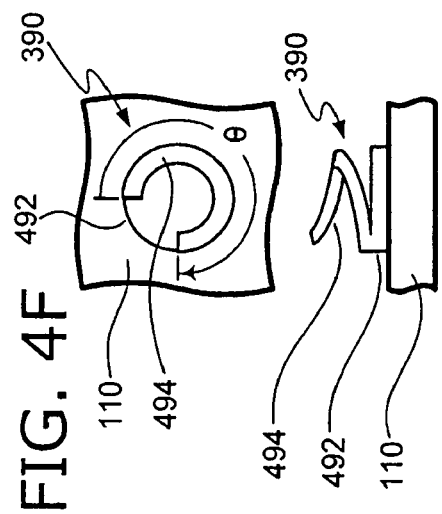
Figure 4E:
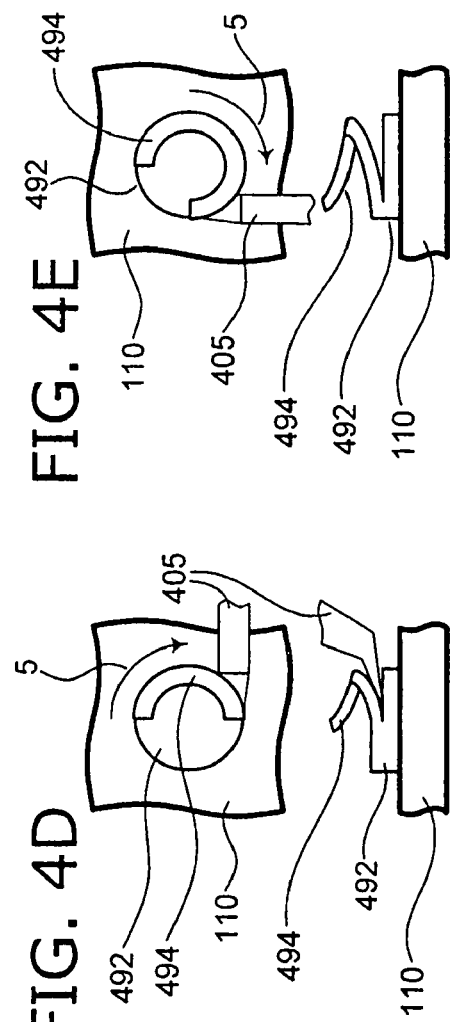
Figure 4F:
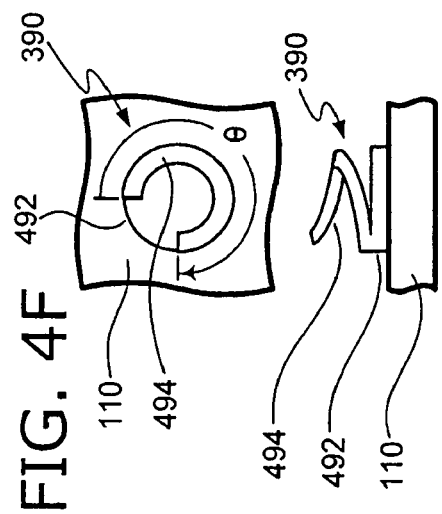
Figure 4H:
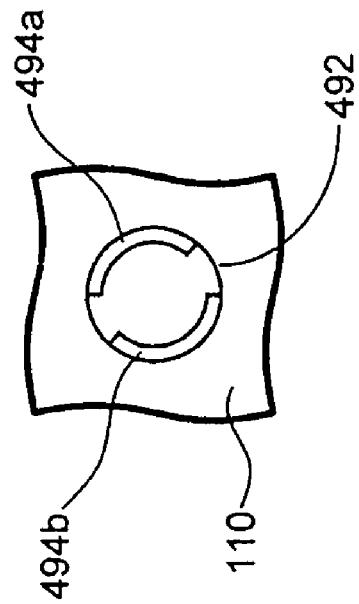
Figure 4G:
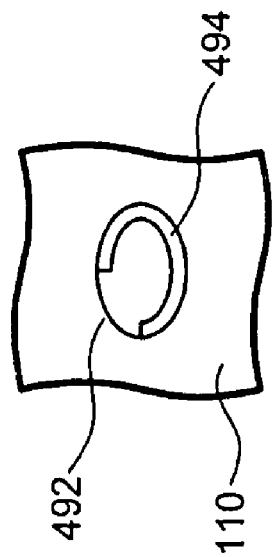

Illustrated in FIGS. 4A through 4F, as well as FIGS. 4G and 4H, are embodiments of the formation of the skived contact 390 shown in FIG. 3. Referring first to FIG. 4A, a body of metal 492 is disposed on the circuit board 110. In one embodiment, a single spring contact 390 will be formed from this metal body 492; however, in other embodiments multiple spring structures may be formed from the same metal body. It should be noted that in each of FIGS. 4A-4F, a plan view of a portion of circuit board 110 and metal body 492 (and ultimately contact 390) is shown in the upper portion of the figure, whereas a side elevation view of these structures is shown in the lower portion of the figure. In each of FIGS. 4G and 4H, only a plan view is illustrated.

The metal body 492 may have any suitable shape. In one embodiment, as shown in the figures, the metal body 492 may comprise a circular-shaped pad or column extending upwards from the board 110. It should be understood, however, that metal body 292 may have any other suitable shape (e.g., an oval-shaped pad or column, etc.). Also, body 492 may comprise any suitable metal amenable to the skiving process. For example, the metal body 492 may comprise copper, a copper alloy (e.g., beryllium copper), aluminum, an aluminum alloy, brass and other brass alloys, phosphor bronze, nickel silver, etc. Further, in other embodiments, the body 492 may comprise an electrically conductive metal, and the metal body 492 may be electrically coupled with one or more conductors in the substrate 110.

Referring to FIG. 4B, a skiving tool 405 is shown, and this skiving tool will be used to form a spring contact by skiving. Skiving tool 405 may comprise any suitable blade or cutting tool capable of performing a skiving operation on the metal body 492 to form an electrical contact 390, which in this instance includes a coil-like spring. The skiving tool 405 may be constructed from any suitable material (e.g., carbide, tungsten carbide, high strength steel, etc.).

Referring to FIG. 4C, skiving has commenced, and the cutting tool 405 has engaged the metal body 492. In the embodiment of FIGS. 4A-4F, the cutting tool 405 has engaged a portion of the circular metal body 492 proximate the body's periphery (e.g., a portion having a width that is less than or equal to a radius of the metal body). The cutting tool 405 is moving in a circular motion relative to the metal body 492, as denoted by the arrow 5 in each of FIGS. 4C-4E. As the cutting tool 405 engages the metal body 492, a portion 494 of the metal body is cut away, and this cut-away portion 494 begins to separate and, in this instance, curl upwards away from the underlying body 492. Because the cutting tool 405 is moving in a circular direction relative to the circular-metal body 492, the cut-away portion 494 will have a hoop- or coil-like structure.

As shown in FIGS. 4D and 4E, with continued circular movement of the cutting tool 405 relative to the metal body 492, the length of the skived away coil-like structure 494 increases, and this structure continues to curl or bend upwards away from the underlay body 492. In FIG. 4E, the cutting tool 405 is shown at the point of maximum cutting distance into the metal body 492. It should be noted that, for clarity and ease of illustration, the cutting tool 405 is only shown in the upper plan view in FIG. 2E.

Referring to FIG. 4F, skiving is complete, and the cutting tool 405 has been retracted from the metal body 492. After removal of the cutting tool, the skived portion 494 remains curled upwards (or otherwise separate from the body 492), and this upwardly extending skived portion 494 may form a spring electrical contact (in this case, a coil-like spring). The remaining portion of the metal body 492 is secured to the circuit board 110 and provides a base for the skived coil spring 494. Together the base (un-skived portion of metal body 492) and the spring contact (skived portion 494) form a spring contact 390, and this spring contact comprises a single piece of material.

The total angle θ (see FIG. 4F) through which the cutting tool 405 moves relative to the circular body 492—and, hence, the length of the coil spring structure 494 that is skived away—can be varied depending upon the desired characteristics (e.g., the spring constant, etc.) of the spring contact 390. In the embodiment of FIG. 4F, the cutting tool 405 traversed through an angle of approximately 270 degrees. However, in other embodiments, the cutting tool 405 may traverse though an angle of approximately 90 degrees or more, and in another embodiment the cutting tool may traverse through an angle greater than 360 degrees (e.g., the skived coil spring 494 may comprise multiple turns).

In FIGS. 4A-4F, the metal body 494 from which the coil-like spring 494 was skived comprises a circular-shaped body. However, as noted above, the disclosed embodiments are not limited to any particular shape. For example, as shown in FIG. 4G, a coil-like spring structure 494 may be skived from an oval-shaped metal body 492. Further, in the embodiments of FIGS. 4A-4F (as well as FIGS. 2A-2F), a single spring structure was skived from the underlying metal body. However, in other embodiments, multiple spring structures may be formed. By way of example, as shown in FIG. 4H, two (or more) coil-like spring structures 494a, 494b have been skived from a circular-shaped metal body 492 (and it should be understood that, in the embodiments of FIGS. 2A-2F, multiple cantilever-like spring structures may be skived from a single metal body).

Figure 5:
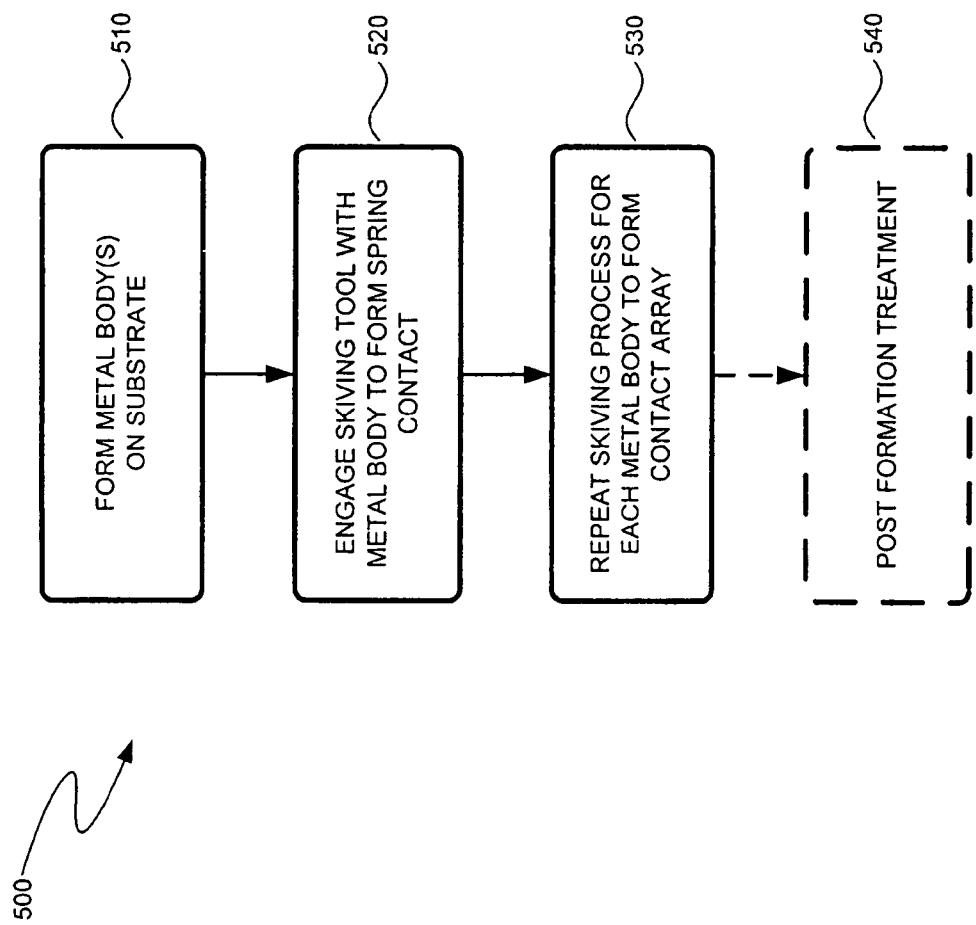
FIG. 5 is a block diagram illustrating an embodiment of a method of forming an electrical contact on a substrate using a skiving technique.

Referring now to FIG. 5, shown is a block diagram illustrating an embodiment of a method of forming an electrical contact on a substrate using a skiving technique. With reference to block 510 in this figure, one or more metal bodies are formed on a circuit board or other suitable substrate. The metal bodies may be arranged on the substrate in any suitable pattern, and in one embodiment the metal bodies are oriented in an array corresponding to a set of electrical leads on an IC device. Any suitable process or combination of processes may be employed to form the metal bodies, including lithography, blanket deposition techniques such as chemical vapor deposition (CVD) or physical vapor deposition (PVD), electroplating or electroless plating, and/or etching processes. The metal bodies may be formed from any metal (or other conductive material) that is amenable to skiving, including copper, a copper alloy (e.g., beryllium copper), aluminum, an aluminum alloy, brass and other brass alloys, phosphor bronze, nickel silver, etc. Also, the metal bodies may have any suitable thickness, and in one embodiment the metal bodies have a thickness in a range between approximately 100 μm and 1 mm.

Referring to block 520 in FIG. 5, a skiving tool engages one (or more) of the metal bodies to form a spring contact from the metal body. The spring contact may comprise a cantilever-like spring (e.g., see FIGS. 1 and 2A-2I), a coil-like spring (e.g., see FIGS. 3 and 4A-4H), or other suitable type of spring. Further, two or more spring structures may be formed from each metal body (or a selected number of the metal bodies). The skived-away spring structures may have any suitable thickness. According to one embodiment, the skived-away spring structure has a thickness of 100 μm or greater. However, in other embodiments, a skived spring structure may have a thickness of less than 100 μm.

As set forth in block 530 of FIG. 5, the skiving process may be repeated on the remaining metal bodies to form an array of electrical contacts. In one embodiment, the metal bodies are skived sequentially one at a time. However, in other embodiments, two or more metal bodies may be skived simultaneously. In a another embodiment, all of the metal bodies may be skived simultaneously in a single pass.

Optionally, in a further embodiment, as shown in block 540, one or more post-skiving treatments may be performed. Examples of post-skiving operations that may be performed include cleaning, heat treatments such as annealing, the application of one or more coatings, or any combination of these and other desired processes.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

What is claimed is:

1. A method of forming an electrical contact on a substrate comprising:
    providing a multi-layer substrate having a metal body formed directly on a surface thereof, the multi-layer substrate including at least one dielectric layer and at least one metal layer, the at least one metal layer including a number of conductors disposed on the at least one dielectric layer; and
    engaging a skiving tool with a portion of the metal body to form a spring, wherein a remaining portion of the metal body provides a base that remains secured to the multi-layer substrate;
    wherein the spring extends from the base and has an end for making electrical contact with a lead of an integrated circuit (IC) device;
    wherein the base is electrically coupled with at least one of the conductors of the multi-layer substrate.

2. The method of claim 1, wherein the spring comprises a cantilever-like spring.

3. The method of claim 1, further comprising:
    engaging the skiving tool with the metal body to form second spring;
    wherein the second spring extends from the base and has an end for making electrical contact with the lead of the integrated circuit device.

4. The method of claim 1, wherein the metal body comprises a metal selected from a group consisting of copper, aluminum, brass, bronze, nickel, silver, and alloys thereof.

5. The method of claim 1, wherein the multilayer substrate includes a number of other metal bodies, the method further comprising:
    engaging the skiving tool with a portion of each of the other metal bodies to form a spring,
    wherein a remaining portion of each other metal body provides a base that remains secured to the multilayer substrate;
    wherein each of the springs extends from its respective base and has an end for making electrical contact with a lead of the IC device.

6. The method of claim 1, wherein the spring comprises a coil-like spring.

7. The method of claim 6, wherein the coil-like spring includes more than one turn.

* * * * *